(12) United States Patent
Benea et al.

(10) Patent No.: US 12,456,968 B2
(45) Date of Patent: *Oct. 28, 2025

(54) COHERENT SAMPLING TRUE RANDOM NUMBER GENERATION IN FD-SOI TECHNOLOGY

(71) Applicant: Commissariat à l'Energie Atomique et aux Energies Alternatives, Paris (FR)

(72) Inventors: Licinius-Pompiliu Benea, Grenoble (FR); Florian Pebay-Peyroula, Grenoble (FR); Mikael Carmona, Grenoble (FR); Romain Wacquez, Grenoble (FR)

(73) Assignee: COMMISSARIAT À L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 78 days.

This patent is subject to a terminal disclaimer.

(21) Appl. No.: 18/483,251

(22) Filed: Oct. 9, 2023

(65) Prior Publication Data

US 2024/0128957 A1 Apr. 18, 2024

(30) Foreign Application Priority Data

Oct. 14, 2022 (FR) ...................... 2210593

(51) Int. Cl.
*H03K 3/84* (2006.01)
*H03K 5/134* (2014.01)
*H03K 5/00* (2006.01)

(52) U.S. Cl.
CPC ............... *H03K 3/84* (2013.01); *H03K 5/134* (2014.07); *H03K 2005/00195* (2013.01); *H03K 2005/00273* (2013.01)

(58) Field of Classification Search
CPC ..................... H03K 3/84; H03K 5/134; H03K 2005/00195; H03K 2005/00273; G06F 7/588

See application file for complete search history.

(56) References Cited

U.S. PATENT DOCUMENTS 5,912,591 A * 6/1999 Yamada ................. H03K 3/354
331/108 C
9,846,568 B2 * 12/2017 Hamilton ............... G06F 7/588

OTHER PUBLICATIONS

Preliminary Search Report for French Application No. 2210593 dated May 23, 2023, 3 pages.
(Continued)

*Primary Examiner* — Daniel C Puentes
(74) *Attorney, Agent, or Firm* — Jordan IP Law, LLC

(57) ABSTRACT

The present description concerns a random number generation circuit (2) of correlated sampling ring oscillator type comprising: two identical ring oscillators (RO1, RO2) implemented in CMOS-on-FDSOI technology; a circuit (104) sampling and storing an output (O1) of one of the two oscillators (RO1) at a frequency of the other one of the two oscillators (RO2) and delivering a corresponding binary signal (Beat); and a circuit (200) controlling back gates of PMOS and NMOS transistors of at least one delay element of at least one of the two oscillators (RO1, RO2) based on a period difference between the two oscillators (RO1, RO2).

15 Claims, 3 Drawing Sheets

(56) References Cited

OTHER PUBLICATIONS

Peetermans, Adriaan, Vladimir Rožić, and Ingrid Verbauwhede. "Design and Analysis of Configurable Ring Oscillators for True Random Number Generation Based on Coherent Sampling." ACM Transactions on Reconfigurable Technology and Systems (TRETS) 14, No. 2 (2021): 1-20.
Fischer, V., A. Aubert, F. Bernard, B. Valtchanov, J. L. Danger, and N. Bochard. "True random number generators in configurable logic devices." Project ANR-ICTeR (2009): 0-58.
Kohlbrenner, Paul, and Kris Gaj. "An embedded true random No. generator for FPGAs." In Proceedings of the 2004 ACM/SIGDA 12th international symposium on Field programmable gate arrays, pp. 71-78. 2004.
Peetermans, Adriaan, Miloš Grujić, Vladimir Rožić, and Ingrid Verbauwhede. "A self-calibrating true random number generator." In 2019 29th International Conference on Field Programmable Logic and Applications (FPL), pp. 428-428. IEEE, 2019.
Peetermans, Adriaan, and Ingrid Verbauwhede. "An energy and area efficient, all digital entropy source compatible with modern standards based on jitter pipelining." IACR Transactions on Cryptographic Hardware and Embedded Systems (2022): 88-109.
Tang, Qianying, Bongjin Kim, Yingjie Lao, Keshab K. Parhi, and Chris H. Kim. "True random number generator circuits based on single-and multi-phase beat frequency detection." In Proceedings of the IEEE 2014 Custom Integrated Circuits Conference, pp. 1-4. IEEE, 2014.

\* cited by examiner

COHERENT SAMPLING TRUE RANDOM NUMBER GENERATION IN FD-SOI TECHNOLOGY

FIELD

The present disclosure generally concerns electronic circuits, and, more particularly, random number generation circuits.

BACKGROUND

Many electronic systems implement functionalities or applications, for example cryptographic primitives (generation of session keys, digital signatures, maskings, etc.), using random numbers. For this purpose, these electronic systems comprise a random number generation circuit, also more simply called random number generator (RNG). A random number generator comprises a true random number generation circuit, also more simply called true random number generator (TRNG). The unpredictability of the generated random numbers enables, for example, to ensure the unpredictability of the outputs of a cryptographic primitive to guarantee the security level of this primitive.

True random number generators are based on one or a plurality of physical phenomena to generate the randomness from which the random numbers are generated, these physical phenomena for example being radiations, phase noise, optical phenomena, etc.

The present disclosure more particularly concerns true random number generators based on ring oscillators, the randomness then resulting from the clock jitter, that is, over the interval between the theoretical period of a ring oscillator and the real or effective period of this oscillator.

A plurality of types of true random number generator based on ring oscillators are known, for example elementary ring oscillator true random number generators (ERO TRNG), multiple ring oscillators true random number generators (MURO TRNG), self-timed ring true random number generators (STR TRNG), transition effect ring oscillator true random number generators (TERO TRNG), and coherent sampling ring oscillator true random number generators (COSO TRNG).

COSO-type true random number generators have the following advantages: an implementation simpler than those of generators of MURO TRNG type, an output rate higher than that of generators of ERO TRNG type, and a power consumption lower than that of generators of STR TRNG type.

However, known true random number generators of COSO TRNG type have various disadvantages.

SUMMARY

There exists a need for a coherent sampling ring oscillator true random number generation circuit which overcomes all or part of the disadvantages of known coherent sampling ring oscillator true number generation circuits, for example as concerns the setting of the frequency of the ring oscillators of the coherent sampling ring oscillator true number generation circuit.

An embodiment overcomes all or part of the disadvantages of known coherent sampling ring oscillator true number generation circuits.

An embodiment provides a random number generation circuit of correlated sampling ring oscillator type comprising:

a first ring oscillator and a second ring oscillator, each comprising delay elements series-connected in a closed loop, the first and second oscillators being identical and implemented in complementary metal oxide semiconductor on fully depleted silicon-on-insulator technology;

a first circuit configured to sample and store the state of an output of the first oscillator at a frequency of an output of the second oscillator and to deliver a corresponding binary signal; and a second circuit configured to control back gates of PMOS and NMOS transistors of at least one delay element of at least one of the first and second oscillators, based on a period difference between the outputs of the first and second oscillators.

According to an embodiment, the control of the back gates of said PMOS and NMOS transistors of said at least one delay element is configured to increase a frequency of the first oscillator with respect to a frequency of the second oscillator when the frequency of the output of the first oscillator is lower than the frequency of the output of the second oscillator, and to decrease the frequency of the first oscillator with respect to the frequency of the second oscillator when the frequency of the output of the first oscillator is greater than the frequency of the output of the second oscillator.

According to an embodiment, the second circuit is configured to control the back gates of said PMOS and NMOS transistors of said at least one delay element to decrease the period difference.

According to an embodiment, the second circuit is configured to control the back gates of said PMOS and NMOS transistors of said at least one delay element so that the period difference is at least N times smaller than the period of the second oscillator, with N a number determined so that a contribution of the thermal noise is preponderating over a contribution of the quantization noise in the jitter of the output of the second oscillator.

According to an embodiment, N is greater than or equal to 1,000, for example equal to 1,000.

According to an embodiment, the second circuit comprises a counter configured to count, at a frequency of the output of the second oscillator, a number of times when said binary signal is in a first binary state for a duration of N periods of the output of the second oscillator.

According to an embodiment, said duration is a sliding duration.

According to an embodiment, the second circuit further comprises a comparator configured to compare said number with a value equal to N/2.

According to an embodiment, the second circuit is configured to control the back gates of said PMOS and NMOS transistors of said at least one delay element based on an output signal of the comparator indicating the result of said comparison.

According to an embodiment, the second circuit comprises a phase frequency detector configured to receive the outputs of the first and second oscillators.

According to an embodiment, the random number generation circuit comprises at least one charge pump controlled by the phase frequency detector and configured to charge and discharge a capacitive element connected to an output of said at least one charge pump, a voltage for controlling the back gates of said PMOS and NMOS transistors of said at least one delay element being available across the capacitive element.

According to an embodiment, the second circuit is configured to control the back gate of each of the PMOS and NMOS transistors of a single one of the first and second oscillators.

According to an embodiment, the second circuit is configured to deliver a same first voltage to the back gate of each of the PMOS transistors of said a single one of the first and second oscillators, and a same second voltage to the back gate of each of the NMOS transistors of said a single one of the first and second oscillators.

According to an embodiment, the second circuit is configured to control the back gate of each of the transistors of each of the first and second oscillators.

According to an embodiment, the second circuit is configured to deliver a same first voltage to the back gate of each of the PMOS transistors of the first oscillator, a same second voltage to the back gate of each of the NMOS transistors of the first oscillator, a same third voltage to the back gate of each of the PMOS transistors of the second oscillator, and a same fourth voltage to the back gate of each of the NMOS transistors of the second oscillator.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

It is known by those skilled in the art that a random number generation circuit generally comprises a true random number generation circuit, which comprises an entropy (or randomness) source, and a processing circuit connected to the output of the true random number generation circuit and configured to increase the rate of the sampled randomness source, the processing circuit currently comprising a pseudo-random number generation circuit (PRNG). The rest of the present disclosure more particularly concerns a true random number generation circuit, and, more particularly still, the sampled entropy source of this circuit. For clarity, only the steps and elements useful to the understanding of the described embodiments have been shown and are detailed. In particular, known processing circuits intended to increase the rate of a sampled randomness source, usual circuits or usual applications comprising a true random number generation circuit have not been described or detailed, the described embodiments and variants of the sampled entropy source, or sampled physical randomness source, being compatible with these usual processing circuits, and with these usual circuits and applications comprising a true random number generation circuit.

In the rest of the disclosure, the expressions "true random number generation circuit" and "true random number generator" indifferently designate a true random number generation circuit or a random number generation circuit comprising a true random number generation circuit.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1:
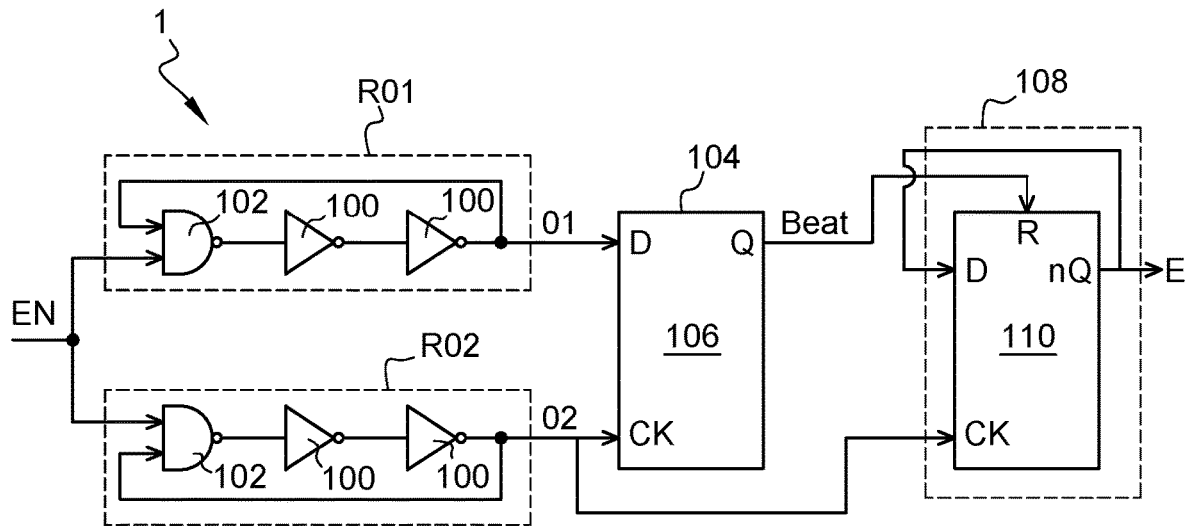
FIG. 1 shows, in the form of blocks, an example of a coherent sampling ring oscillator random number generation circuit.

FIG. 1 shows, in the form of blocks, an example of a coherent sampling ring oscillator true number generation (COSO TRNG) circuit 1, and, more particularly, a portion only of the sampled entropy source of circuit 1.

Circuit 1 comprises two ring oscillators RO1 and RO2. The two oscillators RO1 and RO2 are identical, that is, they comprise the same delay elements series-connected in a closed loop (or ring) comprising an odd number of inverting functions. Each of oscillators RO1 and RO2 receives, for example, a signal EN having a first binary state enabling to close the loop of the oscillator to activate the oscillator so that oscillations propagate in the oscillator, and having a second binary state enabling to open the loop of the oscillator so as to deactivate the oscillator to stop the propagation of the oscillations in the oscillator.

As an example, as illustrated in FIG. 1, each oscillator RO1, RO2 comprises a same even number of inverters 100 in series between an output of a NAND gate 102 and an input of gate 102, the other input of gate 102 receiving signal EN.

The two oscillators RO1 and RO2 supply two respective periodic square signals O1 and O2. Due to the fact that oscillators RO1 and RO2 are identical, the two signals O1 and O2 have, at least in theory, identical frequencies. The frequency of signals O1 and O2 depends on the delay introduced by each delay element 100, 102 series-connected in the loops of respective oscillators RO1 and RO2.

Circuit 1 further comprises a circuit 104 configured to sample and store the state of the output O1 of oscillator RO1, at the frequency of the output O2 of oscillator RO2, that is, synchronously with output O2. In other words, at each edge of a first type, for example rising, of signal O2, circuit 104 is configured to update the binary state of a binary output signal Beat of circuit 104 based on, or according to, the binary state of signal O1, and then to hold this updated binary state of signal Beat until the next edge of the first type of signal O2. Still in other words, signal Beat is synchronous with signal O2.

In the example of FIG. 1, circuit 104 is implemented by a D flip-flop, bearing reference numeral 106 in FIG. 1.

Flip-flop 106 comprises a D data input receiving signal O1, a synchronization input CK receiving signal O2 and, in the example of FIG. 1, a Q output delivering signal Beat updated with the binary state of signal O1 at each edge of the first type of signal O2. In another example, flip-flop 106 comprises an nQ output delivering signal Beat updated with the complementary of the binary state of signal O1 at each edge of the first type of signal O2, that is, with a low binary state when signal O1 is in the high state and with a high binary state when signal O1 is in the low state.

Signal Beat oscillates between its two binary states, that is, between its first binary state and its second binary state according to whether signal O1 is ahead or phase-lagged with respect to O2. In other words, signal Beat is the image of the phase interval between signals O1 and O2. Still in other words, signal Beat indicates the sign of the phase interval between signals O1 and O2. Due to the fact that this phase interval depends on the random jitter of each of oscillators RO1 and RO2, the physique randomness used in circuit 1 is the phase noise and signal Beat is the image of this phase noise. This signal Beat is then used to generate a true random number. For example, the length (or duration) of one of the binary states of signal Beat, for example its high state, is then used to generate a true random number. As an example, in circuit 1, a small difference between the periods of the two oscillators RO1 and RO2 modifies the period of signal Beat, and the random numbers are generated by the variations of the period of signal Beat, the phase between signals O1 and O2 being, for example, constantly varying between $-\Pi/2$ and $\Pi/2$.

In the example of FIG. 1, signal Beat is supplied to a circuit 108 of circuit 1. Circuit 108 is configured to receive signal Beat and signal O2 and to deliver, based on the received signals Beat and O2, a random output signal E.

As a non-illustrated example, circuit 108 may comprise a counter configured to increment at the frequency of signal O2, for example at each edge of a first type of signal O2, when signal Beat is in a first binary state, for example the low state, and to be reset when signal Beat is in a second binary state, for example the high state. In other words, this counter measures, in number of periods of signal O2, the duration for which signal Beat remains at its first binary state. The counter is, for example, followed by a circuit selecting the least significant bit of the output signal of the counter, this least significant bit being preferably re-sampled at the frequency of signal Beat to ensure the stability and corresponding to the random output signal E of circuit 108.

In the example of FIG. 1, the counter of circuit 108 is implemented by a D flip-flop, bearing reference numeral 110 in FIG. 1, configured to functionally correspond to keeping the least significant bit of the counter described in the previous example. For example, flip-flop 110 has its data input D connected to its nQ output, its synchronization input CK connected to signal O2, and an R reset input receiving signal Beat. The nQ output of flip-flop 110, preferably re-sampled at the frequency of signal Beat to ensure the stability, then corresponds to the random output circuit E of circuit 108. In another example not illustrated, the Q output of flip-flop 110 is connected to the D input of flip-flop 110.

Those skilled in the art are capable of providing other examples of circuit 108.

In practice, for circuit 1 to deliver a true random signal E, that is, for circuit 1 to be a true random number generation circuit, the period interval between signals O1 and O2, that is, the interval between the period of signal O1 and that of signal O2, must be very low as compared with the period of these signals, and in particular with the period of signal O2 which rates storage operations.

Those skilled in the art are capable of determining what the term very low here signifies. For example, those skilled in the art are capable of determining a maximum value that the period interval should not exceed in order for the accuracy with which the clock jitter is measured to be satisfactory, that is, in order for the resolution of signal Beat to be sufficient to measure the clock jitter of signal O2 which is, for example, approximately three orders of magnitude smaller than the period of signal O2.

For example, the inventors have shown by using the Allan variance that it is desirable for the maximum period interval between signals O1 and O2 to be N times lower than the period of signal O2, and thus that the period of signals O1 and O2 is N times smaller than a period of signal Beat, with N a number determined so that the contribution of the thermal noise is preponderating over the contribution of the quantization noise, for example so that the thermal noise is at least ten times higher than the quantization noise, in the jitter of signal O2. As an example, N is greater than or equal to 1,000, for example equal to 1,000.

In other words, when the maximum interval between the periods of signals O1 and O2 is N times lower than the period of signal O2, the resolution of signal Beat is 1/N and, to measure by means of signal Beat a jitter of signal O2 where the contribution of the thermal noise is preponderating over the contribution of the quantization noise, N is, for example, selected to be greater than or equal to 1,000, for example equal to 1,000.

To ascertain that the period difference between signals O1 and O2 is very small as compared with the period of signals O1 and O2, there exist ring oscillators having reconfigurable structures implemented on an FPGA ("Field Programmable Gate Array"). However, these reconfigurable ring oscillator structures are bulky.

To ascertain that the period difference between signals O1 and O2 is very small as compared with signals O1 and O2, there also exist ring oscillators comprising capacitive elements with a settable value controllable at the input of each delay element of these oscillators. However, the ranges of values that these variable capacitances can take and the placement and routing of each oscillator will have to be adapted to each change of technology, which is not desirable. Further, the introduction of these variable capacitances increases the bulk and/or the power consumption of circuit 1.

According to an embodiment, there is provided a true random number generation circuit 2 similar to the circuit 1 described hereabove, where oscillators RO1 and RO2 are implemented in complementary metal oxide semiconductor (CMOS) and on fully depleted silicon on insulator (FDSOI) technology, and where the back gates of PMOS (P-channel MOS transistor) and NMOS (N-channel MOS transistor) transistors of at least one delay element of at least one of oscillators RO1 and RO2 is controlled by a control (or calibration) circuit 200 of circuit 2.

By controlling the back gates of PMOS and NMOS transistors of at least one of the delay elements of oscillators RO1 and RO2, it is then possible to modify the frequencies of oscillators RO1 and RO2 with respect to each other, to decrease the period difference between signals O1 and O2 down to very low values as compared with the periods of signals O1 and O2. As an example, when a delay element of ring oscillator RO1 or RO2 comprises PMOS and NMOS transistors having back gates controlled by control circuit 200, these PMOS and NMOS transistors of the delay element comprise at least the PMOS and NMOS transistors of the delay element which have they front gates connected to the output of the previous delay element in the ring oscillator.

The modification of the frequencies of oscillators RO1 and RO2 by controlling the back gates of PMOS and NMOS transistors of at least one of the delay elements of oscillators RO1 and RO2 to obtain a period difference between signals O1 and O2 smaller than a targeted value is more accurate than if the modification of the frequencies of oscillators RO1 and RO2 was implemented due to a current starving method.

According to an embodiment, when a delay element of ring oscillator RO1 or RO2 comprises PMOS and NMOS transistors having back gates controlled by control circuit 200, the control of these back gates by circuit 200 is based on the period difference between signals O1 and O2. For example, circuit 200 is then capable of obtaining an indication of the current value of the period difference between signals O1 and O2, for example based on signal Beat or based on signals O1 and O2 directly, although those skilled in the art are capable of providing other ways of obtaining this indication.

According to an embodiment, the control of the back gate of PMOS and NMOS transistors of at least one delay element of at least one of oscillators RO1 and RO2 by circuit 200 is configured to decrease the period difference between signals O1 and O2, for example down to a value smaller than or equal to a targeted value, this targeted value of the difference between the periods of signals O1 and O2 being for example N times shorter than the period of signal O2, with N determined so that, in the jitter of signal O2, the contribution of the quantization noise is negligible, for example at least ten times lower, as compared with the contribution of the thermal noise which is the entropy source. As an example, N is greater than or equal to 1,000, for example equal to 1,000.

More particularly, according to an embodiment, circuit 200 is configured to control the back gate of PMOS and NMOS transistors of at least one delay element of oscillators RO1 and RO2 so that:
the frequency of oscillator RO1 decreases with respect to that of oscillator RO2 when the frequency of signal O1 is faster than that of signal O2, that is:
the frequency of oscillator RO1 is decreased while that of oscillator RO2 remains unchanged, or
the frequency of oscillator RO1 is decreased and, meanwhile, that of oscillator RO2 is increased, or
the frequency of oscillator RO2 is increased while that of oscillator RO1 remains unchanged; and
the frequency of oscillator RO1 increases with respect to that of oscillator RO2 when the frequency of signal O1 is lower than that of signal O2, that is:
the frequency of oscillator RO1 is increased while that of oscillator RO2 remains unchanged, or
the frequency of oscillator RO1 is increased and, meanwhile, that of oscillator RO2 is decreased, or
the frequency of oscillator RO2 is decreased while that of oscillator RO1 remains unchanged.

According to an embodiment, an indication of the current value of the period difference between signals O1 and O2 is obtained by measuring, in number of periods of signal O2, the period of signal Beat, and the setting of circuit 1 then consists of setting the period of signals O1 and O2 so that the period of signal Beat is equal to N periods of signal O2. For this purpose, a circuit, or counter, configured to count, at the frequency of signal O2, a number of times when signal Beat is in a given binary state for a duration of N periods of signal O2, is provided. Preferably, this duration of N periods of signal O2 is a sliding duration. In other words, the counter is configured to measure, in number of periods of signal O2, the half-period of signal Beat.

According to another embodiment, to obtain an indication of the current value of the period difference between signals O1 and O2, circuit 200 comprises a phase frequency detector configured to receive signals O1 and O2.

Examples of embodiments of such a circuit 2 will now be described.

Figure 2:
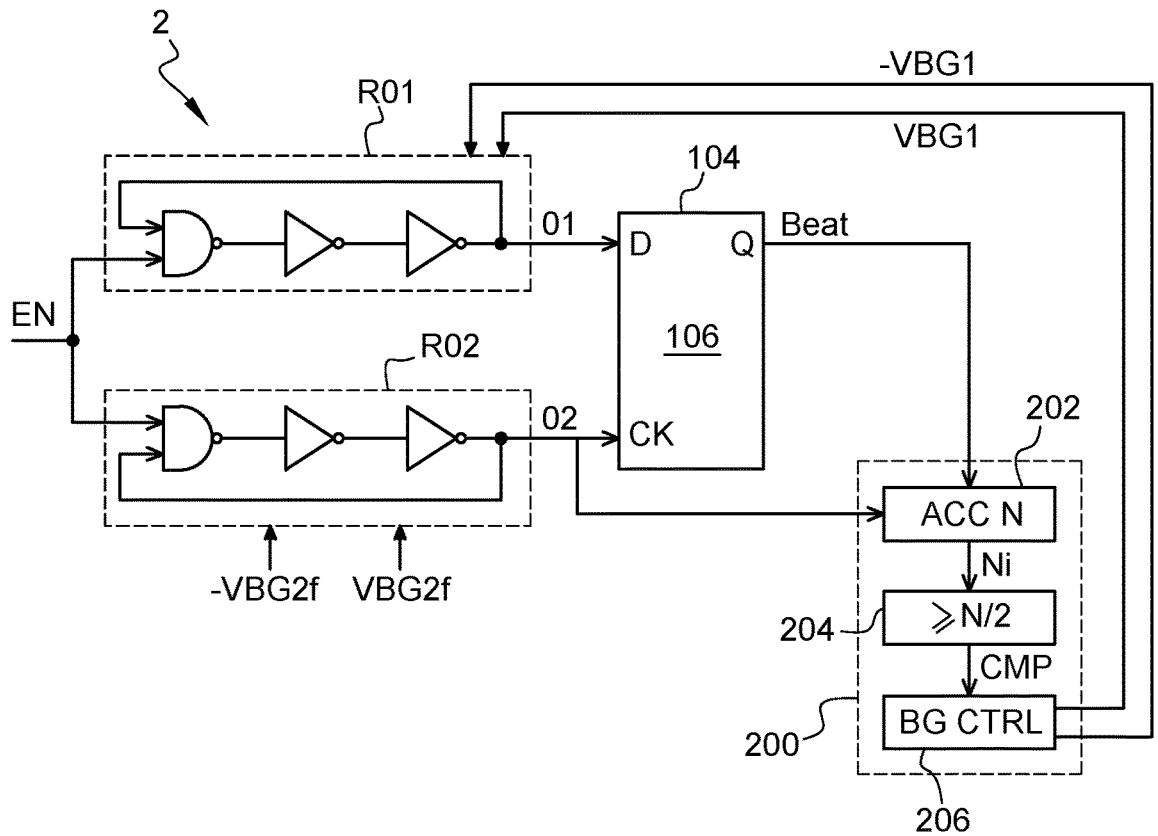
FIG. 2 shows, in the form of blocks, an embodiment of a coherent sampling ring oscillator random number generation circuit.

FIG. 2 shows, in the form of blocks, an example of embodiment of a circuit 2.

Circuit 2 comprises many elements in common with circuit 1, and only the differences between these two circuits 1 and 2 are here highlighted. Further, in FIG. 2, circuit 108 is not shown to avoid overloading the drawing.

In this embodiment, the circuit 200 of circuit 2 obtains an indication of the current value of the period difference between signals O1 and O2 based on signal Beat and on a counter 202 (block "ACC N") rated at the frequency of signal O2. For example, counter 202 is synchronized on the edges of the first type of signal O2, for example the rising edges. The counter 202 of circuit 2 is configured to count, at the frequency of signal O2, the number of times when, for a duration, preferably sliding, of N periods of signal O2, signal Beat is in a given binary state, for example the high state. Counter 202 thus receives the two signals Beat and O2, and delivers an output signal Ni indicating the counted number.

Signal or number Ni is representative of the current value, in number of periods of signal O2, of the half-period of signal Beat, and thus of the period of signal Beat, and thus of the period difference between signals O1 and O2. By counting number Ni for a duration, preferably sliding, of N periods of signal O2, if the periods of signals O1 and O2 are sufficiently close to allow the generation of true random numbers, for example if the period difference between signals O1 and O2 is at least N times lower than the period of signal O2, then number Ni should be equal to N/2 (half-period of signal Beat equal to N/2 periods of signal O2 and period of signal Beat equal to N periods of signal O2). However, if not, for example if the period difference between signals O1 and O2 is not N times lower than the period of signals O1 and O2, then number Ni should be different from N/2.

As an example, as illustrated in FIG. 2:
circuit 104 is synchronized on the rising edges of signal O2,
signal Beat is updated with the binary state of signal O1,
circuit 202 is synchronized on the rising edges of signal O2, and
circuit 202 counts the number Ni of times when signal Beat is in the high state for a duration, preferably sliding, of N periods of signal O2. In this specific example, number Ni is greater than N/2 if the frequency of signal O1 is greater than that of signal O2 and the difference between the periods of signals O2 and O2 is not N times lower than the period of signals O1 and O2, and is lower than N/2 if the frequency of signal O1 is lower than that of signal O2 and the difference between the periods of signals O2 and O2 is not N times lower than the period of signals O1 and O2.

According to an embodiment, circuit 200 comprises a circuit, or comparator, 204 (block "≥N/2") configured to compare the output Ni of counter 202 with value N/2. Circuit 204 delivers a signal CMP indicating the result of this comparison. As an example, signal CMP is a binary signal having a first state indicating that Ni is smaller than N/2 and a second state indicating that Ni is greater than or equal to N/2.

Circuit 200 is then configured to control the back gates of PMOS and NMOS transistors of at least one delay element of at least one of oscillators RO1 and RO2 based on signal Ni.

For example, circuit 200 comprises a circuit 206 (block "BG CTRL") configured to receive signal CMP and to deliver at least one voltage determined by signal CMP to control the back gates of PMOS and NMOS transistors of at least one delay element of at least one of oscillators RO1 and RO2.

In the embodiment of FIG. 2, circuit 200, for example circuit 206, is configured to commander the back gates of PMOS and NMOS transistors of at least one delay element of oscillator RO1, the back gates des transistors of oscillator RO2 being biased by fixed voltages. In other words, circuit 200 is configured to only control the frequency of oscillator RO1.

According to an embodiment, circuit 200, for example circuit 206, is configured to control the back gates of all the transistors of oscillator RO1, by delivering a control voltage VBG1 to the back gates of all the PMOS transistors of oscillator RO1 and a control voltage −VGB1 to the back gates of all the NMOS transistors of oscillator RO1.

As an example, the PMOS, respectively NMOS, transistors are arranged inside and on top of a silicon layer resting on an insulating layer, itself resting on N-type doped silicon (or N well), respectively P-type doped silicon (or P well), forming the back gate electrode of these transistors. In this example, voltage VBG1 is then positive or zero and increases, respectively decreases, to increase, respectively decrease, the frequency of oscillator RO1.

In another example, the PMOS, respectively NMOS, transistors are arranged inside and on top of a silicon layer resting on an insulating layer itself resting on P-type doped silicon (or P well), respectively N-type doped silicon (or N well), forming the back gate electrode of these transistors. In this other example, voltage VBG1 is then negative or zero and increases, respectively decreases, in absolute value to increase, respectively decrease, the frequency of oscillator RO1.

As an example, circuit 200 is further configured to deliver a fixed bias voltage VBG2f, respectively −VBG2f, to the back gates of all the PMOS, respectively NMOS, transistors of oscillator RO2.

In the present disclosure, when it is indicated that circuit 200 controls the back gates of all the transistors of an oscillator RO1 or RO2, this preferably means that circuit 200 controls the back gates of at least all the transistors of the delay elements of the closed loop of the oscillator, that is, of the transistors of the oscillator having a threshold voltage directly influencing the frequency of the oscillations in the oscillator.

As an alternative embodiment not illustrated, circuit 200 is configured to control the frequency of oscillator RO2 only. The implementation of this variant is within the abilities of those skilled in the art based on the description made hereabove of the case where circuit 200 controls the frequency of oscillator RO1 only.

Preferably, the counting duration, which here lasts for N periods of signal O2, is a sliding duration, which enables circuit 200 to continuously control the frequency of at least one of oscillators RO1 and RO2. As an example, the duration of N periods is called sliding when each counting duration of N periods starts while the previous counting duration of N periods is not over, that is, when each counting duration of N periods partly covers the previous duration of N periods and the next counting duration of N periods. As a variant, the counting duration is not a sliding duration, the counter then being reset for each counting duration corresponding to N periods of signal O2. As an example, each counting duration of N periods is called non-sliding when it does not cover, even partly, the counting durations of previous and next N periods. As an example, each non-sliding counting duration of N periods starts with an edge of given type, for example a rising edge, of signal Beat.

As an example, the maximum pitch with which the period of oscillator RO1 is modified with respect to that of oscillator RO2, to be able to obtain a period difference between signals O1 and O2 which is N times shorter than the period du signal O2, is equal to T/N with T the average or theoretical value of the period of signal O2. For example, for T equal to 2 ns, and N equal to 1,000, the period of oscillator RO1 is modified with respect to that of the oscillator with a pitch of at most 2 ps. Those skilled in the art will be capable of determining the corresponding pitch on the control voltages of the back gate(s) of the transistors controlled by circuit 200.

Figure 3:
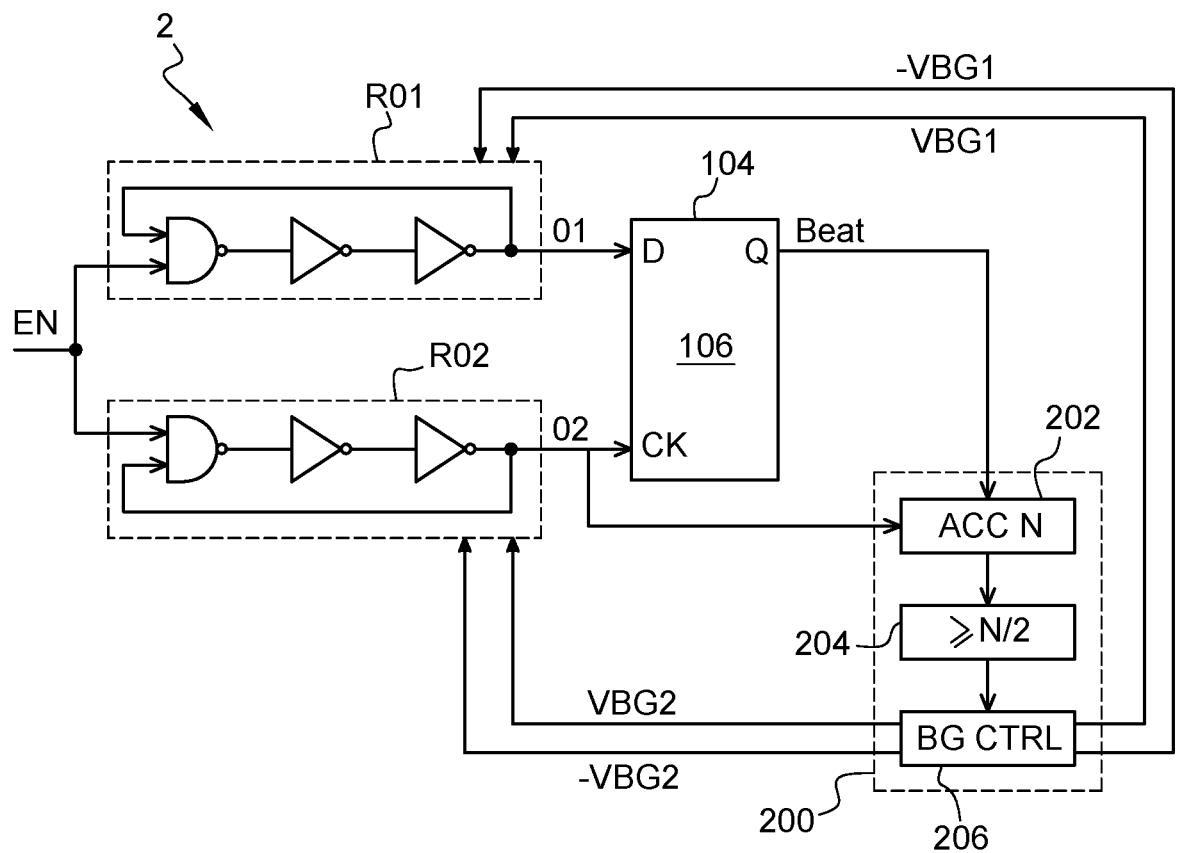
FIG. 3 shows, in the form of blocks, an alternative embodiment of the random number generation circuit of FIG. 1.

FIG. 3 shows, in the form of blocks, an alternative embodiment of the circuit 2 described in relation with FIG. 2. The circuit 2 of FIG. 3 exhibits many similarities with that of FIG. 2, and only the differences between these circuits are here highlighted.

In particular, as compared with what has been described in relation with FIG. 2 where circuit 200 only controls the frequency of a single one of the two oscillators RO1 and RO2, in the variant of FIG. 3 circuit 200 controls the frequency of the two oscillators RO1 and RO2. In other words, in FIG. 3, circuit 200 is configured to control, based on the difference between the periods of signals O1 and O2, the back gates of NMOS and PMOS transistors of at least one delay element of oscillator RO1 and the back gates of NMOS and PMOS transistors of at least one delay element of oscillator RO2.

According to an embodiment, circuit 200, for example circuit 206, is configured to control the back gates of all the transistors of oscillator RO1, for example by delivering a control voltage VBG1 to the back gates of all the PMOS transistors of oscillator RO1 and a control voltage −VBG1 to the back gates of all the NMOS transistors of oscillator RO1, as well as all the transistors of oscillator RO2, for example by delivering voltage VBG2 to the back gates of all the NMOS of oscillator RO2 and a same voltage −VBG2 to all the PMOS transistors of oscillator RO2. Voltages VBG1 and −VBG1 have a same absolute value but opposite polarities and voltages VBG2 and −VBG2 have a same absolute value but opposite polarities.

As an example, voltage VBG2 is equal to voltage VBG1, so that a variation of voltage VBG1 causing an increase or a decrease of the frequency of oscillator RO1 respectively causes a decrease or an increase of the frequency of oscillator RO2. However, those skilled in the art will be capable of providing implementations where voltage VBG2 is different from voltage VBG1 and/or a portion only of the transistors of oscillator RO1 and of oscillator RO2 are controlled by circuit 200.

As compared with the circuit 2 of FIG. 2 where a single oscillator RO1 or RO2 is controlled by circuit 200, the circuit 2 of FIG. 3 is less accurate as concerns the setting of the frequency of oscillator RO1 with respect to that of oscillator RO2, due to the fact that the two oscillators RO1 and RO2 are simultaneously controlled by circuit 200.

Examples of embodiments where circuit 200 controls oscillator RO1 and/or oscillator RO2 by using signal Beat and a counter to obtain an indication of the period differences between the two signals O1 and O2 have been described in relation with FIGS. 2 and 3.

In other examples of embodiment, circuit 200 directly uses signals O1 and O2 to obtain an indication of the period difference between these two signals, for example by means of a phase frequency detector receiving these two signals O1 and O2.

Figure 4:
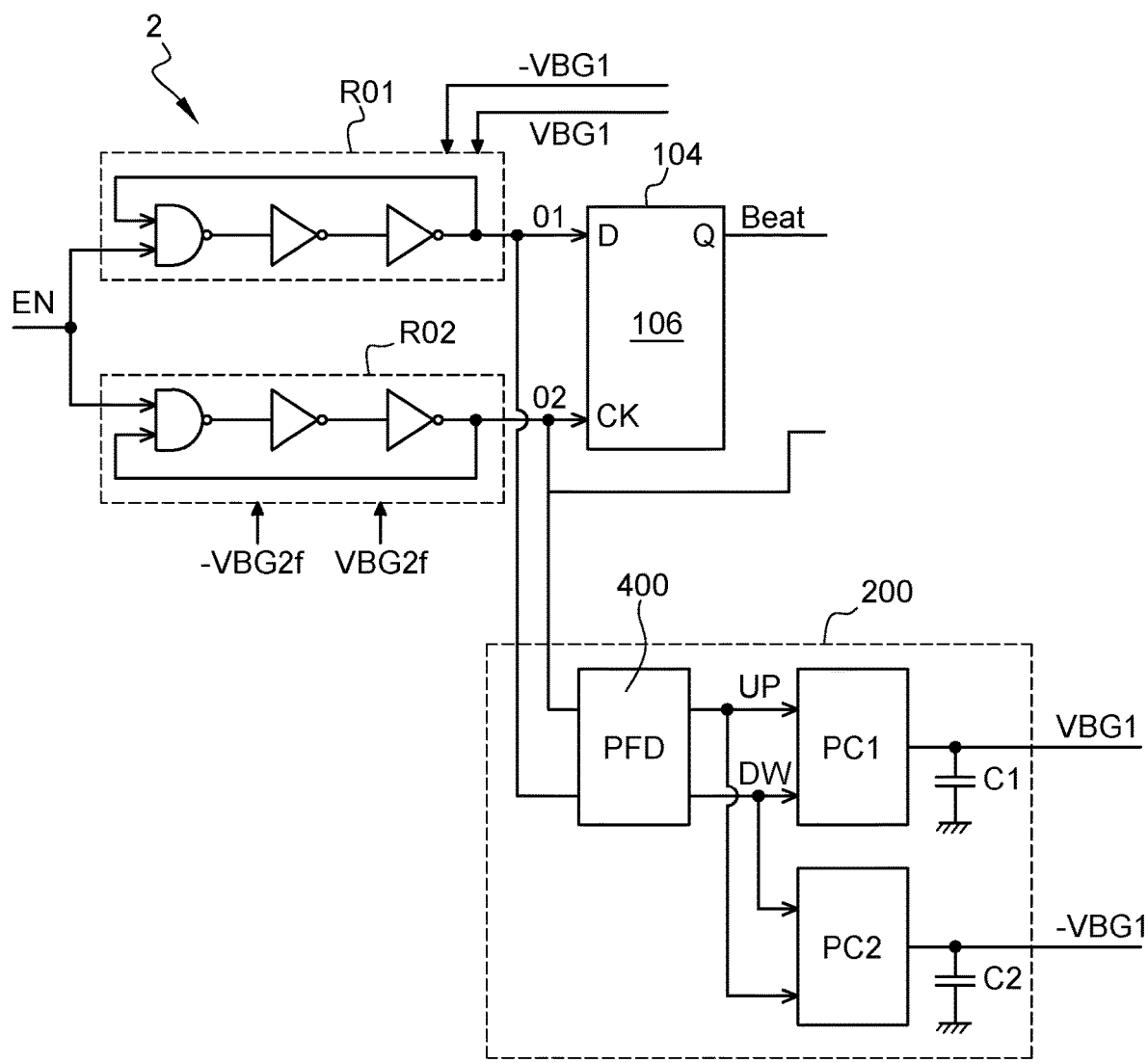
FIG. 4 shows, in the form of blocks, another embodiment of a coherent sampling ring oscillator random number generation circuit.

FIG. 4 shows, in the form of blocks, another embodiment of circuit 2. The circuit 2 of FIG. 4 comprises many similarities with the circuits 2 described in relation with FIGS. 2 and 3, and only the differences between these circuits are here highlighted.

In particular, the circuit 2 of FIG. 4 differs from the previously-described circuits 2 by the implementation of its circuit 200. Indeed, in FIG. 4, circuit 200 directly uses signals O1 and O2 to obtain an indication of the period difference between these signals O1 and O2. Thus, instead of receiving signals Beat and O2 as in the previously-described circuits 200, in FIG. 4, circuit 200 receives signals O1 and O2.

According to an embodiment, circuit 200 comprises a phase frequency detector 400 (block "PFD") receiving signals O1 and O2, and outputting an indication of the value of the period difference between signals O1 and O2. As an example, circuit 400 delivers a pulse UP when signal O1 is phase-lagged with respect to signal O2, pulse UP having a duration representative of, or determined by, the value of the period difference between signals O1 and O2, and a pulse DW when signal O1 is ahead of signal O2, pulse DW having a duration representative of, or determined by, the value of the period difference between signals O1 and O2.

In the example of FIG. 4, circuit 200 is configured to control the back gate of PMOS and NMOS transistors of at least one delay element of oscillator RO1 only. For example, circuit 200 is configured to control the back gate of all the PMOS and NMOS transistors of oscillator RO1, for example by delivering a same voltage VBG1 to the back gates of all the PMOS transistors of oscillator RO1 and a same voltage −VBG1 to the back gates of all the NMOS transistors of oscillator RO1. Preferably, voltages VB1 and −VBG1 have a same absolute value but an opposite polarity (or sign). In the example of FIG. 4, circuit 200 does not control the frequency of oscillator RO2, and the back gates of all the PMOS, respectively NMOS, transistors of oscillator RO2 for example receive a same constant bias voltage VBG2f, respectively −VBG2f.

According to an embodiment, circuit 200 comprises at least one charge pump PC1, PC2 controlled by phase frequency detector 400 and configured to deliver the control voltage to each back gate controlled by circuit 200. For example, each charge pump PC1, PC2 is controlled by phase frequency detector 400 to charge and discharge a capacitive element C1, C2 connected to its output, a control voltage of the back gate of at least one transistor of oscillator RO1 being available across the capacitive element.

As an example, as shown in FIG. 4, circuit 200 comprises a first charge pump PC1 controlled by circuit 400 and a second charge pump PC1 controlled by circuit 400. Charge pump PC1 is configured to charge and discharge, under control of circuit 400, a capacitive element C1 connected on its output and across which is available voltage VBG1. Charge pump PC2 is configured to charge and discharge, under control of circuit 400, a capacitive element C2 connected on its output and across which is available voltage −VBG1.

Those skilled in the art are capable of sizing each charge pump PC1, PC2 of circuit 200, the current sources (not shown in FIG. 4) of the charge pump, and capacitive element connected on the output of this charge pump, for example so that the variations of the voltage across this capacitive element enable to obtain a period difference between signals O1 and O2 which is at least N times shorter than the period of signal O2.

Those skilled in the art are also capable of adapting the description made hereabove in relation with FIG. 4, which corresponds to a case where circuit 200 controls the frequency of oscillator RO1 only, to other cases where either circuit 200 controls the frequency of oscillator RO1 and of oscillator RO2 simultaneously, or circuit 200 controls the frequency of oscillator RO2 only.

In the previously-described examples of embodiments, the edges of the first type of signal O2 are edges of rising type. Those skilled in the art are capable of adapting the description made hereabove of these examples of embodiments to the case where the edges of the first type of signal O2 are edges of falling type.

In the examples of embodiments described hereabove in relation with FIGS. 2 and 3, counter 202 is configured to count the number of times when signal Beat is in the high state during a duration of N periods of signal O2, that is, to measure the duration of the high half-period of signal Beat in number of periods of signal O2. Those skilled in the art are capable of adapting the previously-made description of these examples of embodiments to the case where counter 202 is configured to count the number of times when signal Beat is in the low state during a duration of N periods of signal O2, that is, to measure the duration of the low half-period of signal Beat in number of periods of signal O2.

In the previously-described examples of embodiments, oscillators RO1 and RO2 are configured to receive a signal EN activating or deactivating the oscillation propagation. Those skilled in the art are capable of adapting the previously-made description of these examples of embodiments to the case where the propagation of oscillations in oscillators RO1 and RO2 is not conditioned by signal EN, that is, to the case where the oscillators do not receive signal EN.

Further, in the previously-described examples of embodiments, the delay elements 100 of oscillators RO1 and RO2 are inverting gates (or inverters). However, oscillators RO1 and RO2 may be implemented with any types of delay elements, for example with logic cells of a FPGA.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

What is claimed is:

1. Circuit of correlated sampling ring oscillator random number generation type comprising:
   a first ring oscillator and a second ring oscillator, each comprising delay elements series-connected in a closed loop, the first and second oscillators being identical and implemented in complementary metal oxide semiconductor on fully depleted silicon-on-insulator technology;

a first circuit configured to sample and store the state of an output of the first oscillator at a frequency of an output of the second oscillator and to deliver a corresponding binary signal; and a second circuit configured to control back gates of PMOS and NMOS transistors of at least one delay element of at least first and second oscillators, based on a period difference between the outputs of the first and second oscillators.

2. Circuit according to claim 1, wherein the control of the back gates of said PMOS and NMOS transistors of said at least one delay element is configured to increase a frequency of the first oscillator with respect to a frequency of the second oscillator when the frequency of the output of the first oscillator is lower than the frequency of the output of the second oscillator, and to decrease the frequency of the first oscillator with respect to the frequency of the second oscillator when the frequency of the output of the first oscillator is greater than the frequency of the output of the second oscillator.

3. Circuit according to claim 1, wherein the second circuit is configured to control the back gates of said PMOS and NMOS transistors of said at least one delay element to decrease the period difference.

4. Circuit according to claim 1, wherein the second circuit is configured to control the back gates of said PMOS and NMOS transistors of said at least one delay element so that the period difference is at least N times shorter than the period of the second oscillator, with N a number determined so that a contribution of the thermal noise is preponderating over a contribution of the quantization noise in the jitter of the output of the second oscillator.

5. Circuit according to claim 4, wherein N is greater than or equal to 1,000, for example equal to 1,000.

6. Circuit according to claim 4, wherein the second circuit comprises a counter configured to count, at a frequency of the output of the second oscillator, a number of times when said binary signal is in a first binary state for a duration of N periods of the output of the second oscillator.

7. Circuit according to claim 6, wherein said duration is a sliding duration.

8. Circuit according to claim 6, wherein the second circuit further comprises a comparator configured to compare said number with a value equal to N/2.

9. Circuit according to claim 8, wherein the second circuit is configured to control the back gates of said PMOS and NMOS transistors of said at least one delay element based on an output signal of the comparator indicating the result of said comparison.

10. Circuit according to claim 1, wherein the second circuit comprises a phase frequency detector configured to receive the outputs of the first and second oscillators.

11. Circuit according to claim 10, wherein the random number generation circuit comprises at least one charge pump controlled by the phase frequency detector and configured to charge and discharge a capacitive element connected to an output of said at least one charge pump, a voltage for controlling the back gates of said PMOS and NMOS transistors of said at least one delay element being available across the capacitive element.

12. Circuit according to claim 1, wherein the second circuit is configured to control the back gate of each of the PMOS and NMOS transistors of a single one of the first and second oscillators.

13. Circuit according to claim 12, wherein the second circuit is configured to deliver a same first voltage to the back gate of each of the PMOS transistors of said a single one of the first and second oscillators, and a same second voltage to the back gate of each of the NMOS transistors of said a single one of the first and second oscillators.

14. Circuit according to claim 1, wherein the second circuit is configured to control the back gate of each of the transistors of each of the first and second oscillators.

15. Circuit according to claim 14, wherein the second circuit is configured to deliver a same first voltage to the back gate of each of the PMOS transistors of the first oscillator, a same second voltage to the back gate of each of the NMOS transistors of the first oscillator, a same third voltage to the back gate of each of the PMOS transistors of the second oscillator, and a same fourth voltage to the back gate of each of the NMOS transistors of the second oscillator.

* * * * *